United States Patent [19]
Wu et al.

[11] Patent Number: 5,793,640
[45] Date of Patent: Aug. 11, 1998

[54] CAPACITANCE MEASUREMENT USING AN RLC CIRCUIT MODEL

[75] Inventors: Koucheng Wu, San Jose, Calif.; Yu-Pin Han, Dallas, Tex.; Ying-Tsong Loh, Saratoga, Calif.

[73] Assignee: VLSI Technology, Inc., San Jose, Calif.

[21] Appl. No.: 773,171

[22] Filed: Dec. 26, 1996

[51] Int. Cl.$^6$ ..................................................... G01R 27/00
[52] U.S. Cl. ..................... 364/482; 364/571.01; 364/481; 324/600; 324/601; 324/638
[58] Field of Search ........................................ 364/400, 480, 364/481, 482, 483, 484, 550, 571.01, 578, 800–802; 324/600, 601, 602, 605, 607, 650, 653, 651; 333/24 R, 28 R, 214; 330/75, 85, 107, 109

[56] References Cited

U.S. PATENT DOCUMENTS

| 4,992,740 | 2/1991 | Wakasugi | 324/649 |
| 5,216,373 | 6/1993 | Wakamatsu et al. | 324/720 |
| 5,463,323 | 10/1995 | Wakamatsu | 324/611 |
| 5,532,590 | 7/1996 | Yamanaka | 324/239 |
| 5,633,801 | 5/1997 | Bottman | 364/482 |

OTHER PUBLICATIONS

Baumann, A.; "Measuring device input impedance on Teradyne A500 series test system"; Texas Instruments Technical Journal; pp. 95–105, 1996.

*Primary Examiner*—Emanuel Todd Voeltz
*Assistant Examiner*—Demetra R. Smith
*Attorney, Agent, or Firm*—Patrick T. King

[57] ABSTRACT

A computer-aided method and system are provided for obtaining a measurement of the capacitance value of a device under test (DUT). The complex impedance of a device under test (DUT) is measured at two nearby frequencies using an RLC meter. The two complex impedance values are then stored in a computer readable medium. The DUT is modeled by a programmed computer as a four element RLC model circuit including a resistor and inductor in series with a parallel RC circuit having a single capacitor which represents the capacitance of the DUT. Four equations which describe the electrical characteristics of the four element RLC model circuit are stored in a computer readable medium. The four measured values of complex impedance are substituted by the computer into the four stored equations. Values are obtained for the four individual RLC circuit elements by solving the four equations. The four unknown values are obtained by use of an optimization routine and then stored to a computer readable medium. The value capacitor element representing the capacitance of the DUT is then displayed.

4 Claims, 4 Drawing Sheets

CAPACITANCE MEASUREMENT USING AN RLC CIRCUIT MODEL

BACKGROUND OF THE INVENTION

1 Field of the Invention

This invention relates generally to electronic test measurement instruments and, more particularly, to apparatus and methods for determining the capacitance of an electronic device under test (DUT).

2 Prior Art

Commercially available impedance meters, or RLC meters, typically measure the complex impedance, Z, of an electronic DUT across two terminals as a function of the frequency of the applied signal. A Hewlett Packard HP4275 LCR meter, for example, provides 10 spot frequency measurements from 10 KHz to 10 MHz in a 1-2-4 frequency-multiple step sequence with a 1-3-5 step sequence as an option. Most commercially available impedance meters also provide for a variable voltage level for the applied test signal. The HP4275 LCR meter provides a continuously variable test signal over a range of 1 mV to 1 $V_{rms}$.

Impedance meters measure complex impedance, Z, directly and then use logic circuitry to calculate the real and imaginary components of the complex impedance. The HP4275 LCR meter provides various parameter measurements including equivalent series resistance (ESR), impedance magnitude (Z), phase angle ($\Theta$), reactance (X), susceptance (B), conductance (G), inductance (L), capacitance (C), resistance (R), dissipation (D), and quality factor (Q). The HP4275 LCR meter is adaptable to being computer-controlled through a standard interconnect bus.

In order to derive a capacitance value from a directly measured complex impedance value, the logic circuitry of the prior art impedance meters utilize either a simple parallel RC circuit model or a simple series RC circuit model to model the DUT. Using these simple circuit models and the measured values of complex impedance, the logic circuitry calculates a capacitance value for the DUT.

FIG. 1 shows a series RC circuit having a resistor 100 in series with a capacitor 102. The series RC circuit of FIG. 1 is described by Equation (1):

$$Zs = Rs + j\ 1/(wC_s) = Rs - j\ Xc \qquad (1)$$

where Zs represents the complex impedance of the DUT as modeled by the series RC circuit of FIG. 1. Rs, the real component of Equation (1), has a resistance value equal to the resistance value of the resistor 100. The imaginary component, Xc, of Equation (1) is equal to $-1/(\omega Cs)$, where $\omega$ is the radian frequency of the test signal and $C_s$, the capacitance value of the capacitor 102, represents the capacitance of the DUT as modeled by the series RC circuit of FIG. 1.

FIG. 2 shows a parallel RC circuit including a resistor 200 in parallel with a capacitor 202. The parallel RC circuit of FIG. 2 is described by Equation (2):

$$Yp = Gp + jwCp = 1/Zp = 1/(R+jX) = (R-jX)/(R^2+X^2), \qquad (2)$$

where Yp represents the complex admittance of a DUT as modeled by the parallel RC circuit of FIG. 2. The admittance value Yp, which is equal to the inverse of the corresponding impedance value Zp, is equal to $1/(R+jX)$ where R is the real component of the corresponding impedance value, Zp, and X is the imaginary component of the corresponding impedance value, Zp. Gp, the real component of Equation (2), which has an admittance value equal to the admittance value of the model resistor 201, is equal to $R/(R^2+X^2)$. Cp, the capacitance value of the capacitor 202, represents the capacitance of the DUT. Cp is equal to $-X/\omega(R^2+X^2)$ where $\omega$ is the radian frequency of the applied test signal.

The circuit models of FIGS. 1 and 2, and their respective equations are used alternatively in prior art commercially available impedance meters to derive values for the capacitance of the DUT based on either the series or the parallel circuit models. For example, the HP 4275 LCR meter features a circuit model control switch which models the device under test as either an series RC circuit or as a parallel RC circuit, as respectively shown in FIGS. 1 and 2. This meter provides values of Zs, Rs, and Xc. In a parallel RC mode, this meter provides values of Yp, Gp, and wCp. The capacitance values, $C_s$ and $C_p$, are automatically calculated by the logic circuitry of the HP 4275 LCR meter which substitutes appropriate measured values into Equations (1) and (2) and solves for $C_s$ or $C_p$, as described above.

Devices under test also have parasitic resistance and inductance. The simple two element series RC model of FIG. 1 and the parallel RC circuit model of FIG. 2 do not take into account the error-causing effects of parasitic resistance and inductance. The use of parallel RC and series RC circuit models for deriving a capacitance value from a measured complex impedance does not always provide perfectly accurate capacitance values, particularly at certain frequencies where the effects of parasitic resistance and inductance are most significant. Empirical results show that impedance measurements, which are taken with an LCR meter set to model a DUT as a series RC or parallel RC circuit, are in error if the phase angle of the complex impedance is not close to ninety degrees.

Table I lists two different measured capacitance values for an $n^+/p^-$ well junction diode which is forward biased with 0.4 volts during testing. For each frequency value shown, two corresponding capacitance values, $C_s$ and $C_p$, were obtained using a HP 4275 LCR meter. The values listed in the $C_s$ column were obtained using complex impedance values measured by the HP 4275 LCR meter set to model the diode under test as an series RC circuit as shown in FIG. 1. The values listed in the $C_p$ column were obtained using complex admittance values measured by the HP 4275 LCR meter set to model the diode under test as a parallel RC circuit as shown in FIG. 2.

TABLE I

| Frequency | $C_S$ | $C_P$ |
| --- | --- | --- |
| 10 KHz | .4650E-10 | .2553E-10 |
| 20 KHz | .3044E-10 | .2545E-10 |
| 40 KHz | .2675E-10 | .2529E-10 |
| 100 KHz | .2534E-10 | .2506E-10 |
| 200 KHz | .2501E-10 | .2493E-10 |
| 400 KHz | .2479E-10 | .2476E-10 |
| 1 MHz | .2433E-10 | .2432E-10 |
| 2 MHz | .2378E-10 | .2375E-10 |
| 4 MHz | .2150E-10 | .2147E-10 |
| 10 MHz | .1194E-10 | .1188E-10 |

As shown in the above table, $C_s$ and $C_p$ vary the most from each other at low frequencies, that is, between 10 KHz and 100 KHz, due to the aforementioned parasitic resistance and inductance of the device under test and the failure of the circuit models of FIGS. 1 and 2 to take the parasitic resistance and inductance into account.

SUMMARY OF THE INVENTION

Accordingly, it is an object of the present invention to provide a method for deriving the capacitance of a DUT from complex impedance measurements of the DUT at multiple frequencies. The instant method provides a model which takes into account the parasitic resistance and inductance of a DUT. The method of the instant invention is computer implemented.

A modeling step models the DUT with a four element RLC circuit model. The RLC circuit model includes a parallel RC circuit, which has a first resistor in parallel with a capacitor, both of which are in series with an inductor and a second resistor. This RLC circuit model has four circuit elements of unknown value, including a single capacitance element which represents the capacitance of the DUT. In order to obtain the capacitance value of the DUT from measured values of complex impedance, four equations are used to obtain the values of all four of the circuit elements of the RLC circuit model.

A measuring step uses a standard complex impedance meter to measure the complex impedance of the DUT at two distinct frequency values. These two complex impedance measurements provide four measured values: one real value and one imaginary value of impedance for each of the two frequencies.

A substitution step substitutes the four measured impedance values into an equation which describes the RLC circuit model. Four resulting equations are then solved by use of an optimization routine to obtain the values of the four individual RLC model circuit elements. The resultant capacitance value for the model capacitor element, which represents the capacitance of the DUT, is then stored in a computer readable medium and displayed as required.

BRIEF DESCRIPTION OF THE DRAWINGS

The accompanying drawings, which are incorporated in and form part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

The instant invention provides a computer-implemented method for obtaining the capacitance of a DUT from complex impedance measurements of the DUT at multiple frequencies.

Figure 3:
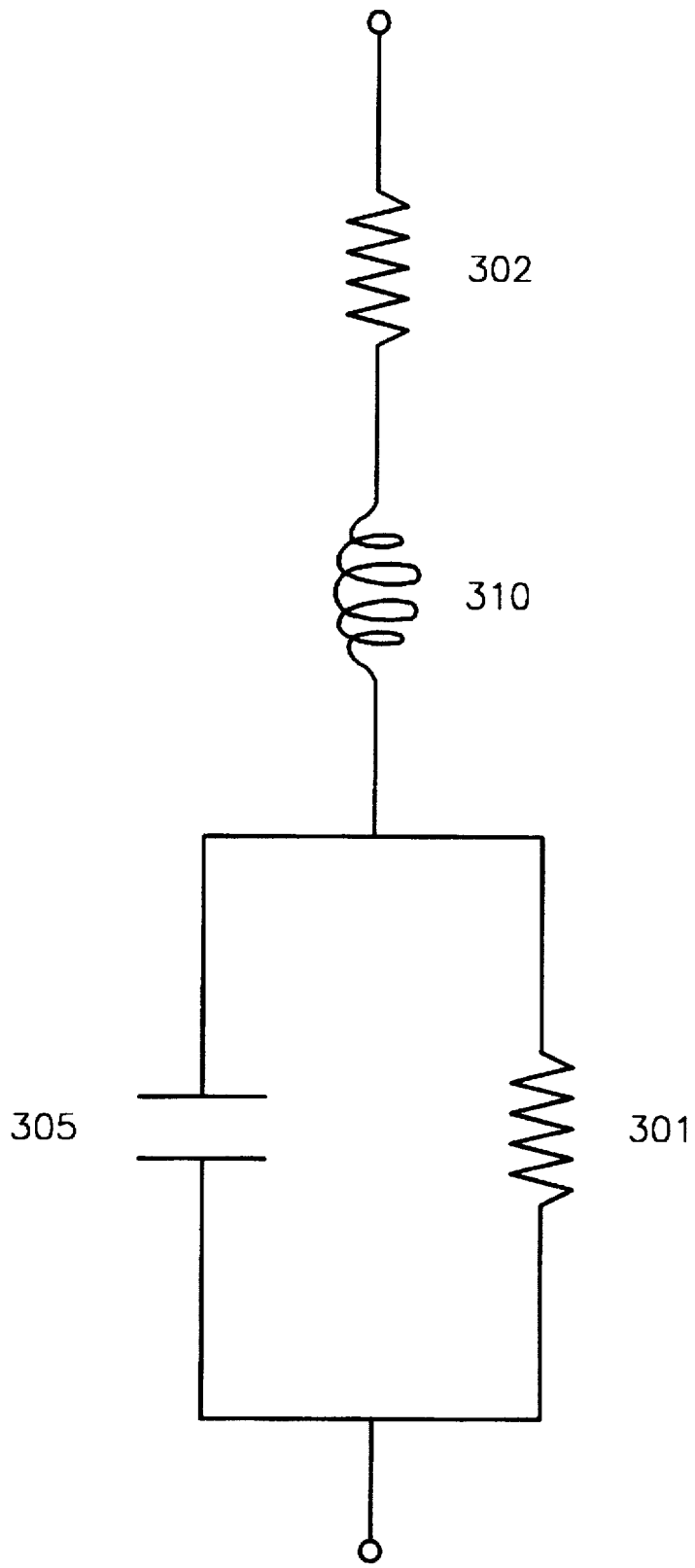
FIG. 3 is a schematic diagram of an RLC circuit for use in modeling the complex impedance of a device under test, according to the instant invention.

FIG. 3 shows a four element RLC circuit 300 used to model a DUT when practicing the method of the instant invention. The RLC circuit includes a parallel RC circuit having a first resistor R1 in parallel with a capacitor C. The parallel RC circuit is in series with an inductor L and a second resistor R2. The circuit of FIG. 3 is described by Equation (3):

$$Z_{RLC}=R2+G_1/(G_1^2+w^2C^2)+(jwL-(jwC/(G_1^2+w^2C^2))). \qquad (3)$$

$Z_{RLC}$ represents the impedance of the RLC series circuit of FIG. 3. G1 represents the admittance value of the first RLC model R1. $R_2$ represents the resistance of the second resistor 302. L represents the inductance of the inductor. C represents the capacitance of the capacitor.

In the method of the instant invention, the capacitance value of the capacitor C represents the capacitance of the DUT. In order to obtain the desired capacitance value of the DUT, as modeled by the RLC circuit model 300, it is necessary to solve for the values of all four of the circuit elements of the RLC circuit model 300. The four unknown circuit values (R1, R2, L, and C) are obtained from four equations describing the RLC circuit model 300.

Figure 4:
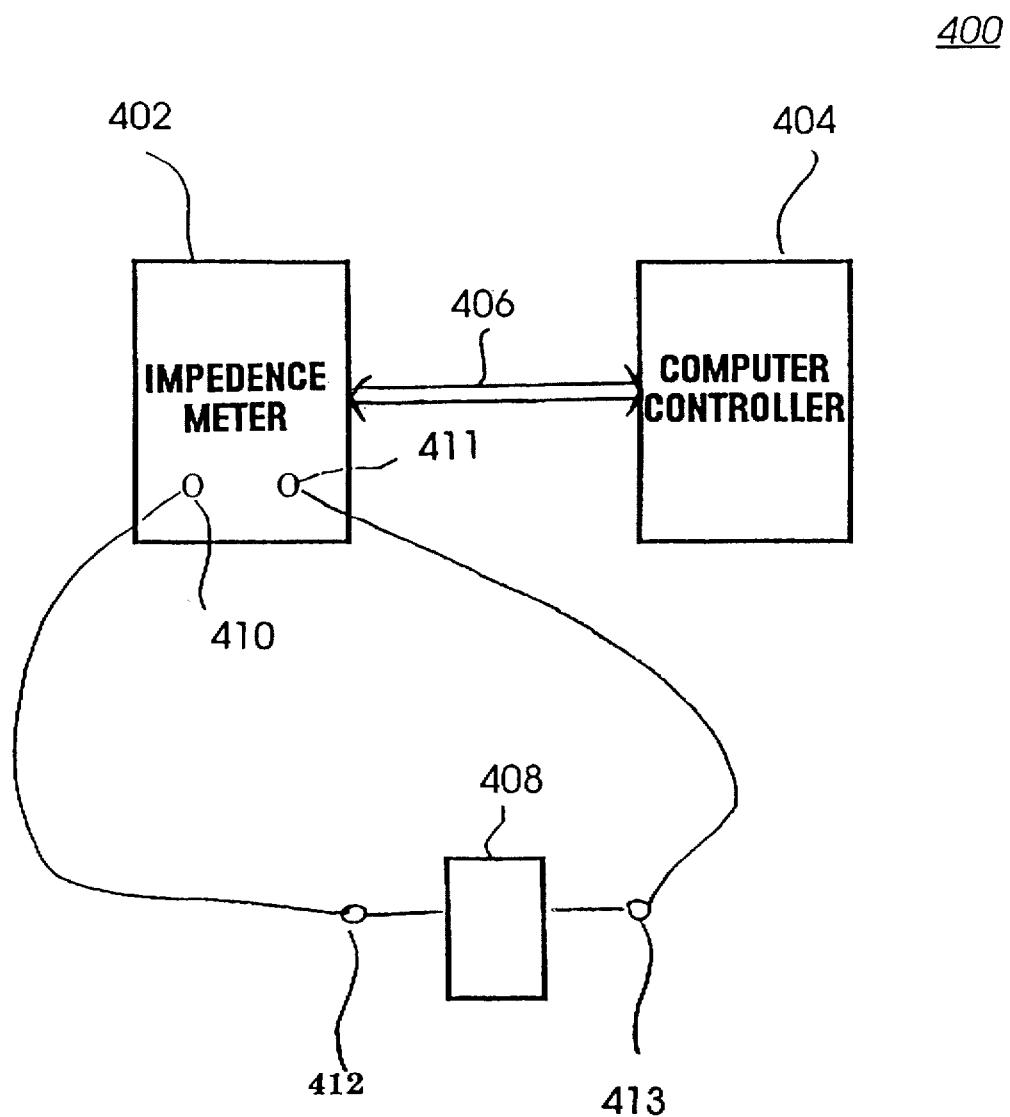
FIG. 4 is a system block diagram of the apparatus used in the instant invention.

FIG. 4 shows a system block diagram 400 of the apparatus used to implement the instant invention. An impedance meter 402, such as an HP4275 LCR meter, is connected to a computer controller 404 through an interconnect bus 406. The computer controller 404 is programmed to control the impedance meter 402 to measure the complex impedance of a DUT 408 at two nearby values of frequency. The computer controller 404 also performs steps which yield a capacitance value for the DUT 408 based on the measured complex impedance values. The impedance meter 402 has an output test terminal 410 at which output signals flow from the meter 402 and an input test terminal 411 at which input signals flow to the meter 402. The output test terminal 410 of the impedance meter is coupled to a first terminal 412 of the DUT 408. The input test terminal 411 of the impedance meter is coupled to a second terminal 413 of the DUT 408.

Figure 5:
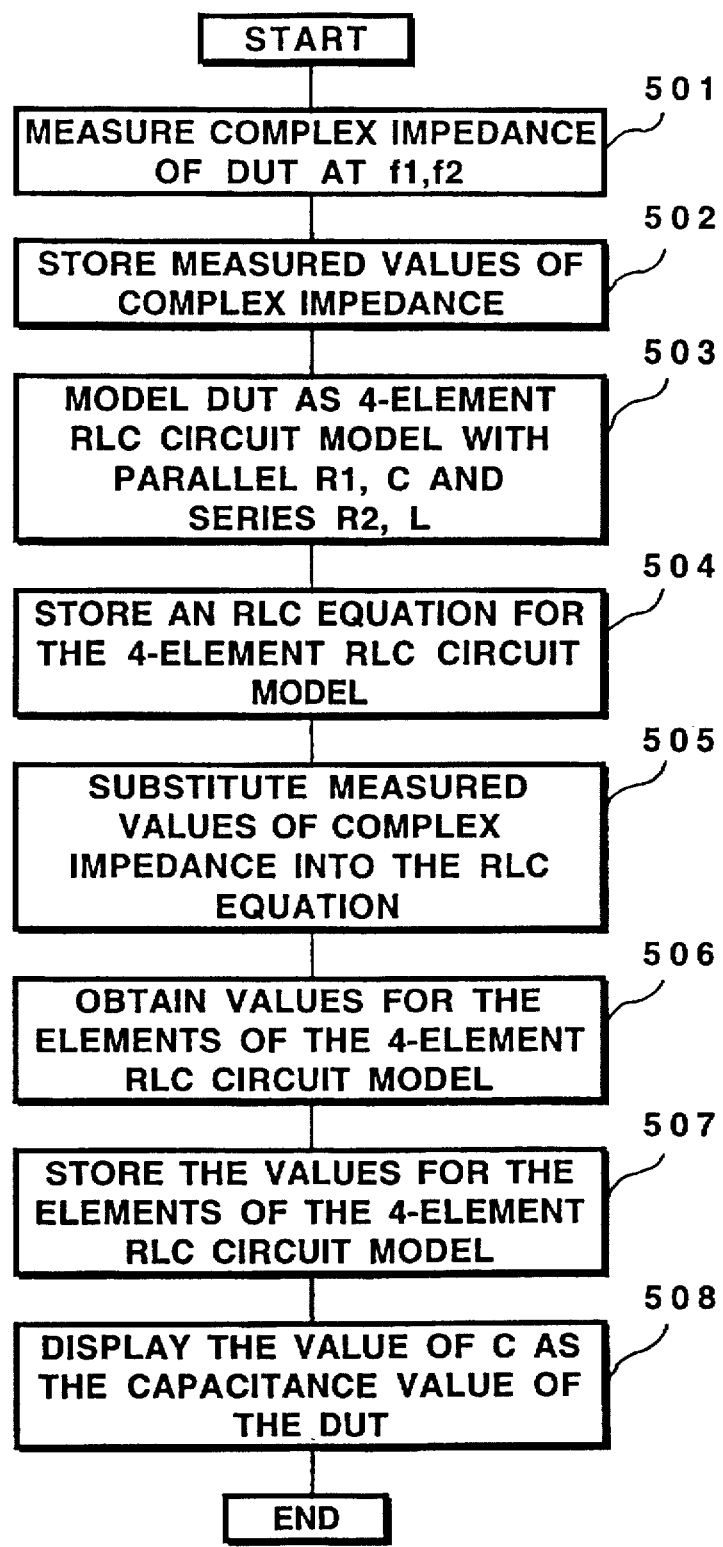
FIG. 5 is a flow chart illustrating steps for implementing the method of the instant invention.

FIG. 5 shows a flow chart diagram depicting a series of computer-implemented steps necessary to implement the process of the instant invention. These steps transform a general use computer into a specific use computer for obtaining the values of the circuit elements of the circuit of FIG. 3.

Four measured values of impedance, two of which are imaginary and two of which are real, are substituted into Equation (3) which describes the RLC circuit model. An optimization routine is used to obtain values for the four individual circuit elements including the desired value of capacitance. The value of the capacitance of the DUT is then stored in a computer readable medium.

Step 501 measures the impedance of the DUT at two nearby frequency values using a complex impedance meter. These two complex impedance measurements yield four measured values: one real value and one imaginary value for the impedance measured at the first frequency and one real value and one imaginary value for the impedance measured at the second frequency.

Step 502 stores the measured complex impedance values from step 501 to a computer readable medium Step 503 models the DUT as the four element RLC circuit of FIG. 3 and as described in equation (3).

Step 504 stores Equation (3) to a computer readable medium.

Step 505 substitutes the measured values of complex impedance into Equation (3) which describes the four element RLC circuit model. Equations (4), (5), (6), and (7) illustrate the substitution process.

$$Z1 = r_1 + jX_1 \ @\ \omega_1 = 2\pi f_1 \quad (4)$$

$$Z2 = r_2 + jX_2 \ @\ \omega_2 = 2\pi f_2 \quad (5)$$

where $Z_1$ is the measured complex impedance value obtained when a test signal with a frequency of $f_1$ is applied to the DUT and $Z_2$ is the measured complex impedance value obtained when a test signal with a frequency of $f_2$ is applied to the DUT. The first and second measured impedance values are then substituted into Equation (3). This substitution process results in Equations (6) and (7):

$$Z_{RLC} = Z1 = r_1 + kX_1 \text{ when } f = f_1 \quad (6)$$

$$Z_{RLC} = Z2 = r_2 + jX_2 \text{ when } f = f_2 \quad (7)$$

where $r_1$ is the real value of the measured complex impedance at $f = f_1$, $r_2$ is the real value of the measured complex impedance at $f = f_2$, $X_1$ is the imaginary value of complex impedance at $f = f_1$, and $X2$ is the imaginary value of complex impedance at $f = f_2$.

In Step 506, values are obtained for the four individual RLC circuit elements by solving the equations (6) and (7) with the substituted values of complex impedance.

An arbitrary fulnction of angular frequency, $P(\omega)$ is defined in Equation (8):

$$P(\omega) = G1^2 + \omega^2 C^2 \quad (8)$$

$P(\omega)$ is substituted into Equations (6) and (7). This substitution process results in Equations (9) through (12):

$$r_1 = R2 + G1/P(\omega 1) \quad (9)$$

$$r_2 = R2 + G1/P(\omega 2) \quad (10)$$

$$X_1 = \omega 1(L - (C/P(w1))) \quad (11)$$

$$X_2 = \omega 2(L - (C/P(\omega 2))) \quad (12)$$

Equation (10) is then subtracted from Equation (9) resulting in Equation (13):

$$r1 - r2 = G1/P(\omega 1) - G1/P(\omega 2) \quad (13)$$

Equation (12) is then subtracted from Equation (11) resulting in Equation (14):

$$X_1/\omega_1 - X_2/\omega_2 = C/P(\omega_2) - /C/P(\omega_1) \quad (14)$$

Equation (13) is then divided by Equation (14) resulting in Equation (15)

$$(r_1 - r_2)/(x_1/\omega_1) - (x2/\omega 2)) = G_1/C \quad (15)$$

The above equations can be solved by use of an optimization routine in order to obtain values for R2, R1, L, and $C_{RLC}$. The first part of the optimization routine requires the making of an initial guess for the value of R1. A starting place is to set R1=Rp from the parallel RC model. Once R1 is obtained, an initial value for the capacitance, C, can be calculated from equation (15). Then R1 and C can be substituted into equation (13). An optimal value for C can then be obtained by adjusting R1 to minimize the error between (r1−r2) and (G1/P(ω1)−G1/P(ω2)) and then substituting the adjusted value of R1 back into equation (13) to yield an optimal value for C. R2 can then be calculated from equations (9) or (10) and L can be calculated from equations (11) or (12).

Figure 1:
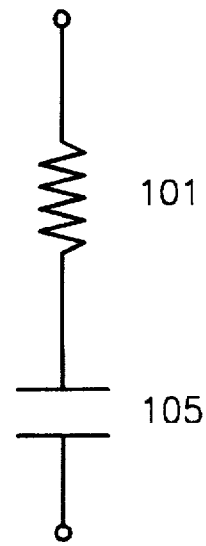
FIG. 1 is a schematic diagram of a series RC circuit used in the prior art to model the complex impedance of a device under test.
Figure 2:
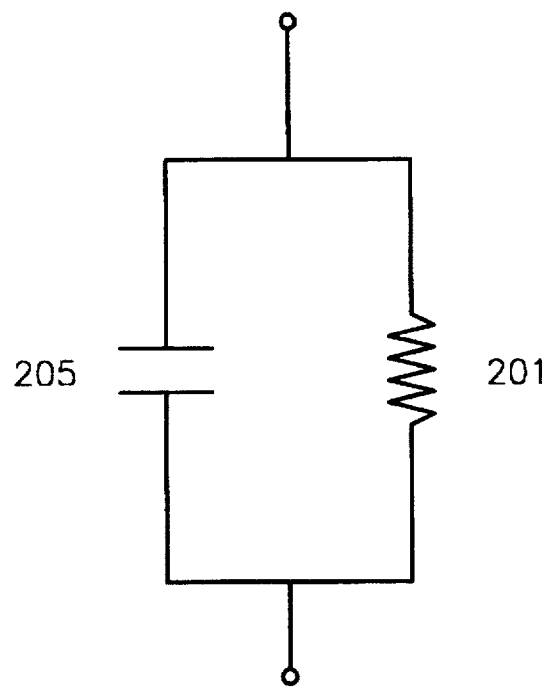
FIG. 2 is a schematic diagram of a parallel RC circuit used in the prior art to model the complex admittance of a device under test.

The below table lists three different capacitance values for an n$^+$/p$^-$ well junction diode which was forward biased at 0.4 volts during testing. A HP 4275 LCR meter was employed to measure the complex impedance of the diode under test in each case. The values listed under the column $C_s$ were obtained using a HP 4275 LCR meter set to model the diode under test as a series RC circuit like the one shown in FIG. 1. The values listed under the column $C_p$ were obtained using a HP 4275 LCR meter set to model the diode under test as a parallel RC circuit like the one shown in FIG. 2. The capacitance values listed under the column $C_{RLC}$ were obtained according to the above described method of the instant invention wherein each of the capacitance values has been assigned to a mid-frequency values defined by Equation (16):

$$\log f_{mid} = (\log f_i + \log f_{i+1})/2 \quad (16)$$

where $f_i$ is the first nearby frequency value, discussed above, and $f_{i+1}$ is the second nearby frequency value discussed above.

TABLE II

| Frequency | $C_S$ | $C_P$ | $C_{RLC}$ |
|---|---|---|---|
| 10 KHz | .4650E-10 | .2553E-10 | .2527E-10 |
| 20 KHz | .3044E-10 | .2545E-10 | .2579E-10 |
| 40 KHz | .2675E-10 | .2529E-10 | .2539E-10 |
| 100 KHz | .2534E-10 | .2506E-10 | .2513E-10 |
| 200 KHz | .2501E-10 | .2493E-10 | .2499E-10 |
| 400 KHz | .2479E-10 | .2476E-10 | .2485E-10 |
| 1 MHz | .2433E-10 | .2432E-10 | .2444E-10 |
| 2 MHz | .2378E-10 | .2375E-10 | .2464E-10 |
| 4 MHz | .2150E-10 | .2147E-10 | .2493E-10 |
| 10 MHz | .1194E-10. | .1188E-10 | |

As shown in Table II above, the $C_{RLC}$ capacitance values, obtained by use of the method of the instant invention, are more consistent over the frequency range from 10 KHz to 10 MHz than the $C_s$ and $C_p$ capacitance values obtained by use of the prior art methods.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A computer-aided method for measuring a capacitance value of a device under test (DUT), comprising: using a computer, performing the following series of steps:

measuring the complex impedance of a device under test at a first frequency value using a complex impedance meter to obtain one real measured component value of impedance and one imaginary measured component value of impedance at the first frequency value;

measuring the complex impedance of the device under test at a second frequency value using a complex impedance meter to obtain a second real measured component value of impedance and a second imaginary measured component value of impedance at the second frequency value;

storing said four measured component values to a computer readable medium;

computer modeling the device under test as a four-element RLC circuit which includes: an RC circuit having a first resistor R1 in parallel with a capacitor C; an inductor L in series with the RC circuit and in series with a second resistor R2, wherein the capacitor C represents the capacitance of the device under test;

storing in a computer readable medium four RLC equations which describe the electrical characteristics of the four-element RLC circuit;

substituting said four measured values of complex impedance into said four RLC equations which describe the four-element RLC circuit model;

obtaining values for the four individual RLC circuit elements by instructing said computer to solve said four RLC equations using said four measured and substituted values of complex impedance by use of an optimization routine;

storing said values for the four individual RLC circuit elements in a computer readable medium; and displaying said obtained capacitance value for said capacitor element.

2. The method of claim 1 wherein the step of obtaining values for the four individual RLC circuit elements by use of an optimization routine includes the steps of:

modeling said device under test as a two element parallel RC circuit including a parallel RC resistor in parallel with a parallel RC capacitor;

measuring the complex impedance of said device under test at said first frequency value using said complex impedance meter, thereby obtaining two measured values, one real value and one imaginary value of impedance measured at said first frequency storing in a computer readable medium, two RC equations which describe the electrical characteristics of said two element parallel RC circuit model;

substituting said two measured values of complex impedance into said two RC equations which describe the two element parallel RC circuit model;

obtaining values for the two parallel RC circuit elements by instructing a computer to solve said two RC equations, using said two measured and substituted values of complex impedance, by use of a closed form solution; and substituting as an initial estimate for the value of said first resistor of said RLC circuit model, the obtained value for said parallel RC resistor into said four RLC equations which describe the four element RLC circuit model and thereby solving by trial and error for the four individual RLC circuit elements of the RLC circuit.

3. A computer implemented and controlled electronic test measurement system for measuring a capacitance across two terminals of an electronic device under test, comprising:

an impedance measurement meter;

a programmable computer for controlling and for receiving data from said impedance meter through an interconnect bus;

said computer being programmed to include an RLC circuit model for the electronic device under test wherein said RLC circuit model comprises: a parallel RC circuit including a first resistor in parallel with a capacitor, an inductor L in series with said parallel RC circuit; and a second resistor in series with said inductor and said parallel RC circuit;

a computer readable medium being encoded with the following set of instructions:

measure the complex impedance of a device under test at a first frequency value and at a second frequency value, using a complex impedance meter, thereby obtaining four measured values, one real value and one imaginary value of impedance measured at said first frequency value and one real value and one imaginary value of impedance measured at said second frequency value;

store said four measured values in a computer readable medium;

model the device under test as a four element RLC circuit, including: an RC circuit, including a first resistor in parallel with a capacitor, said RC circuit in series with an inductor and a second resistor; wherein said capacitor represents a capacitance of said device under test;

store in a computer readable medium, four RLC equations which describe the electrical characteristics of said four element RLC circuit;

substitute said four measured values of complex impedance into said four RLC equations which describe the four element RLC circuit model;

obtain values for the four individual RLC circuit elements by instructing a computer to solve said four equations, using said four measured and substituted values of complex impedance, by use of an optimization routine;

store said values for the four individual RLC circuit elements in a computer readable medium; and display said obtained capacitance value for said capacitor element at a CRT and attributing said capacitance value to said device under test.

4. The computer implemented and controlled electronic test measurement system of claim 3 wherein said instruction to obtain values for the four individual RLC circuit elements by solving said four RLC equations, using said four measured and substituted values of complex impedance, by use of an optimization routine, includes:

modeling said device under test as a two element parallel RC circuit including a parallel RC resistor in parallel with a parallel RC capacitor;

measuring the complex impedance of said device under test at said first frequency value using said complex impedance meter, thereby obtaining two measured values, one real value and one imaginary value of impedance measured at said first frequency;

storing in a computer readable medium, two RC equations which describe the electrical characteristics of said two element parallel RC circuit model;

substituting said two measured values of complex impedance into said two RC equations which describe the two element parallel RC circuit model;

obtaining values for the two parallel RC circuit elements by instructing a computer to solve said two RC equations, using said two measured and substituted values of complex impedance, by use of a closed form solution; and substituting, as an initial estimate for the value of said first resistor of said RLC circuit model, the obtained value for said parallel RC resistor into said four RLC equations which describe the four element RLC circuit model and thereby solving by trial and error for the four individual RLC circuit elements of the RLC circuit.

* * * * *